(12) United States Patent
Noda

(10) Patent No.: US 8,543,887 B2
(45) Date of Patent: Sep. 24, 2013

(54) CODING METHOD AND CODING DEVICE

(75) Inventor: Makoto Noda, Tokyo (JP)

(73) Assignee: Sony Corporation, Tokyo (JP)

( * ) Notice: Subject to any disclaimer, the term of this patent is extended or adjusted under 35 U.S.C. 154(b) by 852 days.

(21) Appl. No.: 12/601,046

(22) PCT Filed: Jul. 10, 2008

(86) PCT No.: PCT/JP2008/062441
§ 371 (c)(1),
(2), (4) Date: Nov. 20, 2009

(87) PCT Pub. No.: WO2009/008460
PCT Pub. Date: Jan. 15, 2009

(65) Prior Publication Data
US 2010/0153823 A1 Jun. 17, 2010

(30) Foreign Application Priority Data
Jul. 10, 2007 (JP) .................. 2007-180940

(51) Int. Cl.
*H03M 13/00* (2006.01)

(52) U.S. Cl.
USPC ........... 714/758; 714/752; 714/728; 714/777; 708/233; 708/250

(58) Field of Classification Search
USPC ................. 714/752, 777, 728, 758; 708/233, 708/250
See application file for complete search history.

(56) References Cited

U.S. PATENT DOCUMENTS

| 8,103,935 B2 | 1/2012 | Matsumoto et al. |
| 8,171,371 B2 | 5/2012 | Matsumoto et al. |
| 2004/0194007 A1* | 9/2004 | Hocevar .................. 714/801 |
| 2007/0043998 A1 | 2/2007 | Lakkis |
| 2007/0094582 A1* | 4/2007 | Noda .................... 714/801 |

(Continued)

FOREIGN PATENT DOCUMENTS

| JP | 2007-129679 | 5/2007 |
| JP | 2009-0121676 | 1/2009 |
| WO | WO 2006/001015 | 1/2006 |

OTHER PUBLICATIONS

Yang, "Design of Efficiently Encodable Moderate-Length High-Rate Irregular LDPC Codes", Apr. 2004, IEEE, IEEE vol. 52, No. 4, p. 564-571.*

(Continued)

*Primary Examiner* — Joshua P Lottich
*Assistant Examiner* — Jeison C Arcos
(74) *Attorney, Agent, or Firm* — Robert J. Depke; The Chicago Technology Law Group, LLC

(57) ABSTRACT

The present invention relates to coding method and coding device that allow Rate-Compatible LDPC (low-density parity-check) codes to have favorable BER performance both with a low code rate and with a high code rate. In coding of LDPC codes that have plural code rates and whose all parity check matrices are composed of plural cyclic matrices, a coder 121 performs the coding in such a way that $1<w_0$ and $w_1<w_0$ are satisfied when the maximum column weight of the cyclic matrices in the check matrix of a certain code whose code rate is not the minimum value among the LDPC codes is defined as $w_0$ and the maximum column weight of the cyclic matrices in the check matrix of a code having a code rate lower than that of the certain code is defined as $w_1$.

20 Claims, 10 Drawing Sheets

(56) References Cited

U.S. PATENT DOCUMENTS

| | | | |
|---|---|---|---|
| 2008/0168324 A1* | 7/2008 | Xu et al. | 714/758 |
| 2009/0217121 A1* | 8/2009 | Yokokawa et al. | 714/752 |
| 2009/0327847 A1* | 12/2009 | Shen et al. | 714/804 |
| 2010/0058140 A1 | 3/2010 | Matsumoto et al. | |
| 2010/0153819 A1* | 6/2010 | Ueng et al. | 714/763 |

OTHER PUBLICATIONS

Myung "Quasi-Cyclic LDPC Codes for Fast Encoding", Aug. 2005, IEEE, IEEE vol. 51, No. 8, p. 2894-2901.*

Li, "Efficient Encoding of Quasi-Cyclic Low-Density Parity-Check Codes", Jan. 2006, IEEE, IEEE vol. 54, No. 1, p. 71-81.*

Shu Lin et al: "Near Shannon Limit Quasi-Cyclic Low-Density Parity-Check Codes", GLOBECOM'03. 2003—IEEE Global Telecommunications Conference. Conference Proceedings. San Francisco, CA, Dec. 1-5, 2003. vol. 4, Dec. 1, 2003, pp. 2030-2035, XP010678585, ISBN: 978-0-7803-7974-9.

Liang Chen et al: "Flexible Hardware Encoding Schemes for Extended Quasi-Cyclic Low-Density Parity-Check Codes", Signal Processing and Its Applications, 2007. ISSPA 2007. 9th International Symposium on, IEEE, Piscataway, NJ, USA. Feb. 12, 2007. pp. 1-4. XP031280733, ISBN: 978-1-4244-0778-1.

Dongsheng Lin et al: "Semi-Random Construction of Quasi-Cyclic LDPC Codes", Communications, Circuits and Systems, 2005. Proceedings. 2005 International Conference on Hong Kong May 27-30, 2005, IEEE, vol. 1, May 27, 2005, pp. 9-13, ISBN: 978-0-7803-9015-7.

Zhichu Lin et al: "A New Design Method of Multi-Rate Quasi-Cyclic LDPC Codes", Communications, Circuits and Systems Proceedings, 2006 International Conference on, IEEE, PI, Jun. 1, 2006, pp. 707-711, XP031010530, ISBN: 987-0-7803-9584-8.

Hyeong-Gun Joo et al, "New Construction of Rate-Compatible Block-Type Low-Density Parity-Check Codes Using Splitting", The 17th Annual IEEE International Symposium on Personal, Indoor and Mobile Radio Communications, 2006, pp. 1-5, XP031023722, ISBN: 978-1-4244-0329-5, figures 5 & 6.

Richard L. Townsend et al, "Self-Orthogonal Quasi-Cyclic Codes", IEEE Transactions on Information Theory, IEEE, Apr. 1, 1967, p. 184, paragraphs 3 & 4, ISSN: 0018-9448.

Andres I. Vila Casado et al, "Multiple Rate Low-Density Parity-Check Codes with Constant Blocklength", Signals, Systems and Computers, 2004, Conference Record of the thirty-eighth Asilomar Conference on Pacific Grove, CA, USA Nov. 7-10, 2004. ISBN: 978-0-7803-8622-8.

ZTE, "Structured LDPC Coding With Rate Matching", 3GPP TSG RAM WG1 #44bis, Athens, Greece, Mar. 27-31, 2006.

Mitsubishi Electric Co., "Performance Improvement of the rate-compatible LDPC codes", 3GPP TSG RAM WG1 Meeting #44bis, Athens, Greece, Mar. 27-31, 2006.

* cited by examiner

FIG. 4

| q=1 | q=2 | | q=4 | | | |
|---|---|---|---|---|---|---|
| 3 | 1 | 2 | 1 | 1 | 0 | 1 |
| 3 | 2 | 1 | 1 | 1 | 1 | 0 |
| 3 | 1 | 2 | 0 | 1 | 1 | 1 |
| 3 | 2 | 1 | 1 | 0 | 1 | 1 |
| 3 | 1 | 2 | 1 | 1 | 0 | 1 |
| 3 | 2 | 1 | 1 | 1 | 1 | 0 |
| 3 | 1 | 2 | 0 | 1 | 1 | 1 |
| 3 | 2 | 1 | 1 | 0 | 1 | 1 |
| 3 | 1 | 2 | 1 | 1 | 0 | 1 |
| 3 | 2 | 1 | 1 | 1 | 1 | 0 |

F I G . 7
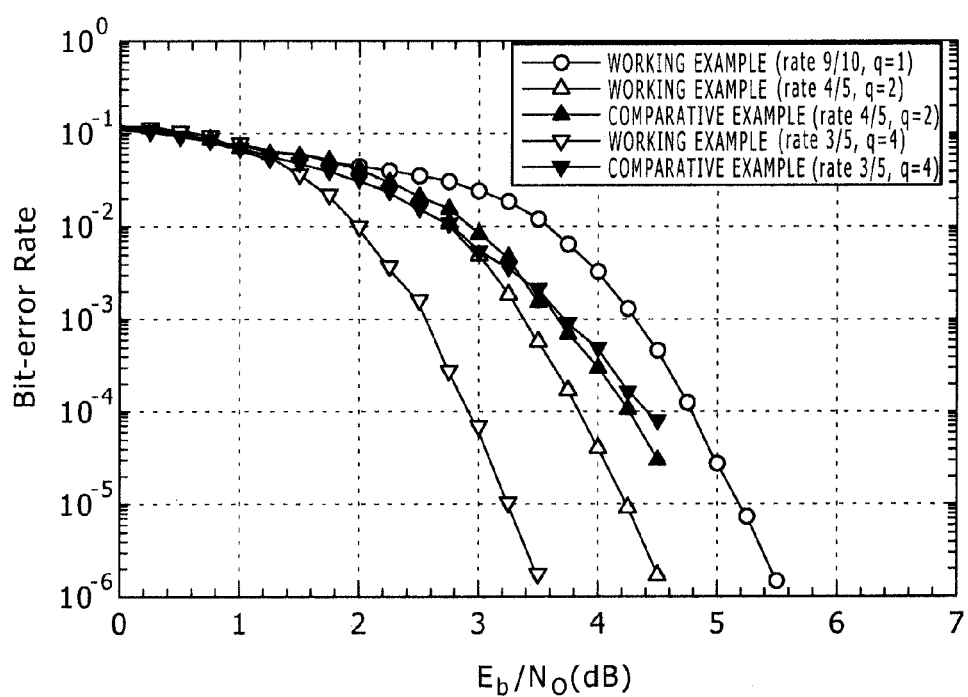

CODING METHOD AND CODING DEVICE

This application is a 371 U.S. National Stage filing of PCT/JP2008/062441, filed Jul. 10, 2008, which claims priority to Japanese Patent Application Number JP 2007-180940 filed Jul. 10, 2007, all of which are incorporated herein by reference.

TECHNICAL FIELD

The present invention relates to coding method and coding device for coding of plural codes having different code rates, and particularly to coding method and coding device that allow codes to have favorable BER (bit error rate) performance both with a low code rate and with a high code rate.

BACKGROUND ART

In general, in many communication devices and recording and reproducing devices, reduction in the BER of digital transmission information is attempted by transmitting a code sequence arising from coding of an input information sequence.

FIG. 1 is a block diagram showing the configuration of a conventional wireless communication system 1 composed of a transmitting device 11 and a receiving device 12.

In FIG. 1, initially an information sequence on the user side is input to a coder 21 and is coded at a rate of k/n to become a code sequence.

Here, k is the information word length, n is the codeword length, and k/n is called the code rate or the coding rate. Furthermore, for the coding, plural kinds of coding, such as encryption, error correction coding, and RLL (run length limited) coding, are frequently combined.

The code sequence is input to a transmitter 22, and transmission signals are transmitted to the space by a transmitting antenna in the transmitter 22 in the case of the transmitting device 11 in the wireless communication system 1.

The transmission signals are input to a receiver 31, and the input signals are converted from the signals in the space to analog reception signals by a receiving antenna in the receiver 31 in the case of the receiving device 12 in the wireless communication system 1.

These analog signals are equalized to a predetermined target equalization characteristic by using an analog equalizer, which is not diagrammatically represented, and then converted every time to digital reception signals in an A/D (analog/digital) converter 32. A phase synchronization circuit, which is not diagrammatically represented, is included in the A/D converter 32.

The digital reception signals are converted to a detected code sequence or a sequence of information on the posterior probability thereof in a code detector 33, and thereafter input to a decoder 34, followed by being decoded to detected information words at a rate of n/k to become a detected information sequence.

However, if the equalization by the analog equalizer is not sufficient, there is also a case in which a digital equalizer is provided between the A/D converter 32 and the code detector 33. Furthermore, in recent years, it is general that a soft-decision detector such as a Viterbi detector is used in the code detector 33. Moreover, if an iterative decoding method is used in the decoder 34, a posterior probability detector is used in the code detector 33 in some cases.

Although the wireless communication system 1 composed of the transmitting device 11 and the receiving device 12 is described in FIG. 1, it is also possible to employ a recording and reproducing system composed of a recording device in which a recorder is provided instead of the transmitter 22 and a reproducing device in which a reproducer is provided instead of the receiver 31. In this case, the processing executed by the coder 21, the A/D converter 32, the code detector 33, and the decoder 34 in the recording and reproducing system is similar to the processing executed in the wireless communication system 1.

By the way, in FIG. 1, various codes are studied as the error correcting codes used in the coder 21 and the decoder 34, and a part of the codes, such as an RS (Reed Solomon) code, has been put into practical use.

In recent years, studies are being intensively promoted on e.g. communication fields such as mobile communication and deep space communication and broadcasting fields such as terrestrial or satellite digital broadcasting. Along with this, studies relating to the code theory for the purpose of enhancing the efficiency in the error correction coding and decoding are also being made.

As a theoretical limit to the code performance, the Shannon limit, given by the so-called channel coding theory of Shannon (C. E. Shannon), is known. One of the purposes of the studies relating to the code theory is to develop codes exhibiting performance close to this Shannon limit. As coding methods exhibiting performance close to the Shannon limit, schemes referred to as so-called turbo coding, such as parallel concatenated convolutional codes and serial concatenated convolutional codes, have been developed.

Furthermore, in recent years, while these turbo codes are developed, studies are being actively made on a low-density parity-check (LDPC (low-density parity-check code) code as one of error correcting codes that are used by the coder 21 and the decoder 34 in FIG. 1 and are effective to reduce the BER of transmission information.

Although the LDPC code was a code that was proposed in 1962 by R. G. Gallager and had been known from old times, recently it is becoming clear that the LDPC code has very excellent decoding performance. The LDPC code is disclosed in Non-patent document 1. Due to recent studies, it is becoming known that, in the case of a code having a low code rate, the LDPC code can achieve performance closer to the Shannon limit when the code length is set longer. Furthermore, the LDPC code has a characteristic that the minimum distance is not necessarily in proportion to the code length.

Here, the LDPC code refers to a parity check code having a parity check matrix (hereinafter, referred to as the check matrix) in which the density of non-zero elements is low (sparse).

Therefore, the LDPC code is the name applied to codes in a very wide range for which the number of non-zero elements in the check matrix is only defined somewhat ambiguously, and does not refer to a code that follows a certain specific code generation rule unlike e.g. the RS code, which is generally well-known. That is, attention needs to be paid to the fact that there exist infinitely many codes that can be called the LDPC code.

Furthermore, in general, one of iterative decoding methods called a Sum-Product decoding method or a Belief-Propagation (BP) decoding method is applied to decoding of the LDPC code.

In the LDPC code, such a code that the column weight of the check matrix is constant is called a regular LDPC code, whereas such an LDPC code that the column weight of the check matrix is not constant is called an irregular LDPC code.

Compared with the regular LDPC code, the irregular LDPC code can achieve higher error correction ability generally but readily leads to a larger circuit scale. However, when the code rate is higher, the difference in the error correction ability between the irregular LDPC code and the regular LDPC code is smaller.

Furthermore, in recent years, a method in which a QC (Quasi Cyclic) code known from old times is used as the LDPC code is attracting attention as one of methods that can reduce the circuit scales of coder and decoder for the LDPC code (in FIG. 1, the coder 21 and the decoder 34).

The regularity of the check matrix of the QC code is very high, and it is expected that, when the QC code is used as the LDPC code, the circuit scales of coder and decoder can be reduced by utilizing the regularity.

Here, the QC code refers to a code in which a sequence arising from the cyclic shift of any codeword by a cycle p ($1 \leq p < n$) that is a certain natural number is a codeword other than the original codeword. The QC code with p=1 is called the cyclic code.

Details of the QC code are disclosed in e.g. Non-patent document 2. The check matrix of the QC code can be represented by using p·q cyclic matrices, in which q is a natural number.

In general, an m rows and m columns (m×m) cyclic matrix is defined as a matrix in which all columns arise from the cyclic shift of any certain column such as the first column.

Specifically, if the leftmost first column vector in an m×m cyclic matrix C is defined as $[x_0 x_1 \ldots x_{m-1}]^T$ (T represents transposition operation), C is represented as the following Equation (1).

[Formula 1]

$$C = \begin{pmatrix} x_0 & x_{m-1} & x_{m-2} & \ldots & x_1 \\ x_1 & x_0 & x_{m-1} & \ldots & x_2 \\ x_2 & x_1 & x_0 & \ldots & x_3 \\ \vdots & \vdots & \vdots & \ddots & \vdots \\ x_{m-1} & x_{m-2} & x_{m-3} & \ldots & x_0 \end{pmatrix} \quad (1)$$

Although the respective columns of the cyclic matrix C are cyclically shifted in the downward direction of the matrix in Equation (1), the cyclic matrix C may be defined by cyclically shifting them in the upward direction. The inverse matrix of a cyclic matrix and the product of two cyclic matrices are each a cyclic matrix.

A check matrix H(p, q) of a QC code, composed of p·q cyclic matrices and having a cycle p, is defined as the following Equation (2) in general.

[Formula 2]

$$H(p, q) = \begin{pmatrix} D_{0,0} & D_{0,1} & \ldots & D_{0,m-1} \\ D_{1,0} & D_{1,1} & \ldots & D_{1,m-1} \\ \vdots & \vdots & \ddots & \vdots \\ D_{q-1,0} & D_{q-1,1} & \ldots & D_{q-1,m-1} \end{pmatrix} \quad (2)$$

Here, in Equation (2), $D_{i,j}$ is an m×p matrix whose j-th column is the h-th column ($0 \leq h < m$) of an m×m cyclic matrix $C_{i,j}$ in a matrix H'(p, q) of the following Equation (3), arising from rearrangement of the columns in H(p, q).

[Formula 3]

$$H'(p, q) = \begin{pmatrix} C_{0,0} & C_{0,1} & \ldots & C_{0,p-1} \\ C_{1,0} & C_{1,1} & \ldots & C_{1,p-1} \\ \vdots & \vdots & \ddots & \vdots \\ C_{q-1,0} & C_{q-1,1} & \ldots & C_{q-1,p-1} \end{pmatrix} \quad (3)$$

Because Equation (3) arises from only rearrangement of the columns of Equation (2), the decoding performance for a reception signal having white noise is the same whichever check matrix the code has. Therefore, hereinafter, no distinction is made between the check matrix having the form of Equation (2) and the check matrix having the form of Equation (3) unless a particular notice is made.

The column weight $w_c$ of the respective cyclic matrices in such a check matrix of a QC code is any integer equal to or larger than zero, and the respective cyclic matrices may have different column weights. However, in general, only a method for designing a check matrix in which q=1 and $w_c \geq 2$ and $w_c$ is constant and a method for designing a check matrix in which $q \geq 2$ and $w_c$ belongs to $\{0, 1\}$ have been known so far as a specific method for designing a check matrix.

A specific method for designing a check matrix in which q=1 and $w_c \geq 2$ is disclosed in e.g. Non-patent document 3 and Non-patent document 4 proposed by the present inventor.

Furthermore, a specific method for designing a check matrix in which $q \geq 2$ and $w_c$ belongs to $\{0, 1\}$ is disclosed in e.g. Non-patent document 5.

If a check matrix in which $q \geq 2$ and $w_c$ belongs to $\{0, 1\}$ is used, there is an advantage that both a regular LDPC code and an irregular LDPC code can be designed comparatively easily.

In addition, if the code length is somewhat long and the code rate is low, employing the relationship $w_c$ belongs to $\{0, 1\}$ also provides an advantage that low-error-rate performance is obtained easily when the code is used as an LDPC code because a short cycle hardly occurs on the check matrix.

On the other hand, as pointed out also in Non-patent document 4, a self-orthogonal QC code having a higher code rate can be designed when a check matrix in which q=1 and $w_c \geq 2$ is used than when a check matrix in which $q \geq 2$ and $w_c$ belongs to $\{0, 1\}$ is used, if the code length is the same. It is generally known that, if the code is self-orthogonal, a cycle with a length of 4 does not exist in the check matrix thereof and the decoding performance thereof can be improved when it is used as an LDPC code.

Coding of a QC code can be carried out by using a very simple shift register circuit. The method therefor is disclosed in e.g. the above-mentioned Non-patent document 2, Patent document 1, and Patent document 2.

Furthermore, as one of methods by which a simple coding circuit can be formed not only for the QC code, a method in which a lower triangular form or a dual diagonal form is made in a part of the check matrix has also been proposed, and details thereof are disclosed in e.g. Non-patent document 6. If this method is used, the code does not necessarily need to be a QC code.

By the way, generally in a wireless communication device (in FIG. 1, the wireless communication system 1), plural error correcting codes having different code rates are prepared and one of them is selected and used depending on the condition of the transmission path in many cases.

In this case, if different coders and decoders (in FIG. 1, the coder 21 and the decoder 34) are provided for all of the codes, the circuit scale often becomes large. Therefore, it is desirable that the circuit of these plural coders and decoders is shared as much as possible. The code that is so designed that the circuit is shared by plural codes having different code rates as much as possible is generally called a Rate-Compatible code.

Also for the LDPC code, various studies to design the Rate-Compatible LDPC (hereinafter, referred to as the RC-LDPC) code are being made in recent years.

For the RC-LDPC code, a scheme in which the check matrix of certain one original code (mother code) is transformed or used as it is to prepare check matrices of codes having other code rates is general. For the RC-LDPC codes reported so far, the check matrices thereof have a form in which $q \geq 2$ and $w_c$ belongs to $\{0, 1\}$ in Equation (2) in many cases, and the content thereof is disclosed in e.g. Non-Patent document 7, Non-patent document 8, and Patent document 3.

Many methods for constructing the RC-LDPC code utilize techniques of puncturing and shortening, which are conventionally well-known in the code theory, and e.g. the method of Non-patent document 7 also utilizes the puncturing.

On the other hand, proposed in Non-patent document 8 and Patent document 3 is a method in which the check matrix of a code having a low code rate is obtained by performing dividing (splitting) of each row in the check matrix of the mother code having a high code rate for each cyclic matrix.

FIG. 2 is a diagram for explaining the row splitting performed in some cyclic matrices in the check matrix, disclosed in Non-patent document 8.

In FIG. 2, by regarding 0 as a zero matrix and regarding 1 as a cyclic matrix of $w_c=1$, the way in which cyclic matrices are split into plural stages in a check matrix in which $q \geq 2$ and $w_c$ belongs to $\{0, 1\}$ is expressed. Furthermore, although what the cyclic matrix of $w_c=1$ is specifically is not diagrammatically represented in FIG. 2, attention needs to be paid to the point that all of the respective cyclic matrices after the splitting except for the zero matrix are formed of the same cyclic matrices as the cyclic matrices before the splitting.

If the number of rows in the check matrix before the splitting is defined as $m_1$, the number of rows in the check matrix after the splitting becomes $2m_1$ through splitting of cyclic matrices into two stages like in FIG. 2. Now, if it is assumed that the check matrix is full rank, i.e. the number of rows in the check matrix is equal to the parity number, the code rate of the code having the check matrix before the splitting is $(n-m_1)/n$, and the code rate of the code having the check matrix resulting from the splitting of each row into two stages is $(n-2m_1)/n$.

If plural check matrices are made by repeatedly performing such cyclic matrix splitting, sharing of the decoding circuit is permitted because the basic form of these check matrices is the same.

The coding and decoding are possible wherever the positions of the parity on the check matrix are. However, in an actual system, because of easiness in terms of the system configuration, it is desirable that the positions of the parity exist with constant intervals on the check matrix or are collectively arranged on the right side or the left side on the check matrix.

However, if plural check matrices are made by performing row splitting like in FIG. 2, it is not necessarily easy to dispose parity at the desired positions on the check matrix for all of the check matrices. Therefore, in Non-patent document 8, each check matrix has a dual diagonal form like that disclosed in Non-patent document 7 in order to arrange parity on the right side of the check matrix. Consequently, the row splitting like in FIG. 2 can not be performed for the parity part, and the regularity thereof is broken.

The method of Patent document 3 is also a method in which splitting is performed in the row direction for each cyclic matrix similarly to the method of Non-patent document 8. However, a specific coding method is not shown in the method disclosed in Patent document 3 although row splitting of the check matrix like that shown in FIG. 2 is performed, including the parity part. For example, in the code disclosed in Patent document 3, the parity part irregularly exists on the check matrix.

Thus, also in Patent document 3, the possibility that a form such as a dual diagonal form must be combined in order to form a practical coder is pointed out. However, in this case, the regularity of the parity part is broken similarly to the case of Non-patent document 8.

Patent document 1: U.S. Pat. No. 3,475,724
Patent document 2: U.S. Pat. No. 6,928,602
Patent document 3: I. Rakkis, "System and Methods for a Turbo Low-density Parity-check Decoder," United States Patten Application Publication, US2007/0043998 A1, February 2007.
Non-patent document 1: R. G. Gallager, "Low Density Parity Check Codes," MIT Press, Cambridge, Mass., 1963.
Non-patent document 2: R. Townsend and E. Weldon, Jr., "Self-Orthogonal Quasi-Cyclic Codes," IEEE Trans. Info. Theory, vol. IT-13, no. 2, pp. 183-195, April 1967.
Non-patent document 3: Y. Kou, S. Lin and M. Fossorier, "Low Density Parity Check Codes on Finite Geometries: A Rediscovery and New Results," IEEE Trans. Info. Theory, vol. 47, no. 7, pp. 2711-2735, November 2001.
Non-patent document 4: M. Noda, "Designing a Self-orthogonal Quasi-cyclic Code with Extended Minimum Hamming Distance," Proc. 4th International Symposium on Turbo Code and Related Topics, Munich, Germany, April 2006.
Non-patent document 5: M. Fossorier, "Quasi-cyclic Low-density Parity-check Codes From Circulant Permutation Matrices," IEEE Trans. Info. Theory, Vol. 50, No. 8, pp. 1788 1793, August 2004.
Non-patent document 6: T. J. Richardson and R. L. Urbanke, "Efficient Encoding of Low-density Parity-check Codes," IEEE Trans. Info. Theory, Vol. 47, No. 2, pp. 638 656, February 2001.
Non-patent document 7: D. Klinc, J. Ha, J. Kim and S. W. McLaughlin, "Rate-compatible Punctured Low-density Parity-check Codes for Ultra Wide Band System," Proc. IEEE (GLOBECOM 2005), pp. 3856 3860.
Non-patent document 8: H-G. Joo, D-J Shin and S-N. Hong, "New Construction of Rate-compatible Block-type Low-density Parity-check Codes using Splitting," Proc. IEEE (PIMRC 2006). September 2006

DISCLOSURE OF INVENTION

Technical Problem

As described above, for the RC-LDPC codes proposed so far, it is general that the check matrices of all of LDPC codes having different code rates are composed of cyclic matrices in which $q \geq 2$ and $w_c$ belongs to $\{0, 1\}$.

However, this method involves a problem that it is comparatively difficult to design a code that can achieve a favorable BER with a high code rate if the code length is constant.

Furthermore, for the RC-LDPC codes disclosed so far, a method is general in which a lower triangular form or a dual diagonal form is employed in the parity part of the check matrix so that the parity positions may be constant positions on the check matrix for all of codes having different code rates.

Thus, there is a problem that the regularity of the check matrix differs between the parity part and the information word part.

The present invention is made in view of these circumstances and makes it possible to make a practical RC-LDPC code that encompasses a code having favorable BER performance with a higher code rate than ever before and also allows coding with a low code rate.

Technical Solution

A coding method as one aspect of the present invention is a coding method of a coding device for coding of LDPC codes that have a plurality of code rates and whose all parity check matrices are composed of a plurality of cyclic matrices. The coding method includes the step of performing coding in such a way that $1<w_0$ and $w_1<w_0$ are satisfied when the maximum column weight of the cyclic matrices in the check matrix of a certain code whose code rate is not the minimum value among the LDPC codes is defined as $w_0$ and the maximum column weight of the cyclic matrices in the check matrix of a code having a code rate lower than the code rate of the certain code is defined as $w_1$.

It is possible that, when one side of the cyclic matrix in a parity check row is defined as m, based on the assumption that a certain row address indicating the position of bit 1 in a certain column in the parity check matrix of a code having a high code rate is b, a row address indicating the position of bit 1 in the column in the parity check matrix of a code having a lower code rate can be represented as b+cm with use of an integer c that is constant for each cyclic matrix and is equal to or larger than 0.

It is possible that the value of b or c is so adjusted that all of the positions of parity in the check matrices of the codes are on the right side on the check matrix, or on the left side, or with constant intervals.

It is possible that the number of cyclic matrices in the parity check matrix of a code having the highest code rate is only one in the row direction, and $2<w_0$ is satisfied.

It is possible that the column weight of the cyclic matrices in the parity check matrix of a code having the lowest code rate is 0 or 1.

It is possible that the column weight of the parity check matrix is constant for the codes of all of the code rates.

It is possible that the column weight of the parity check matrix is 3.

It is possible that all of the codes are self-orthogonal.

It is possible that the minimum hamming distance of all of the codes is at least 6.

It is possible that coding is performed, including a code that is obtained by changing the length m of one side of an identity matrix and has a different code length.

A coding device as one aspect of the present invention is a coding device for coding of LDPC codes that have a plurality of code rates and whose all parity check matrices are composed of a plurality of cyclic matrices. The coding device includes coding means that performs coding in such a way that $1<w_0$ and $w_1<w_0$ are satisfied when the maximum column weight of the cyclic matrices in the certain check matrix whose code rate is not the minimum value among the LDPC codes is defined as $w_0$ and the maximum column weight of the cyclic matrices in the check matrix of a code having a code rate lower than the code rate is defined as $w_1$.

It is possible that, when one side of the cyclic matrix in a parity check row is defined as m, based on the assumption that a certain row address indicating the position of bit 1 in a certain column in the parity check matrix of a code having a high code rate is b, a row address indicating the position of bit 1 in the column in the parity check matrix of a code having a lower code rate can be represented as b+cm with use of an integer c that is constant for each cyclic matrix and is equal to or larger than 0.

It is possible that the value of b or c is so adjusted that all of the positions of parity in the check matrices of the codes are on the right side on the check matrix, or on the left side, or with constant intervals.

It is possible that the number of cyclic matrices in the parity check matrix of a code having the highest code rate is only one in the row direction, and $2<w_0$ is satisfied.

It is possible that the column weight of the cyclic matrices in the parity check matrix of a code having the lowest code rate is 0 or 1.

It is possible that the column weight of the parity check matrix is constant for the codes of all of the code rates.

It is possible that the column weight of the parity check matrix is 3.

It is possible that all of the codes are self-orthogonal.

It is possible that the minimum hamming distance of all of the codes is at least 6.

It is possible that coding is performed, including a code that is obtained by changing the length m of one side of an identity matrix and has a different code length.

In one aspect of the present invention, coding is so performed that $1<w_0$ and $w_1<w_0$ are satisfied when the maximum column weight of the cyclic matrices in the certain check matrix whose code rate is not the minimum among LDPC codes is defined as $w_0$ and the maximum column weight of the cyclic matrices in the check matrix of a code having a code rate lower than the code rate is defined as $w_1$.

Advantageous Effects

As described above, according to one aspect of the present invention, the maximum column weight of the cyclic matrices in the check matrix is decreased to a larger extent for a code having a lower code rate. This makes it possible to perform coding of an RC-LDPC code, allowing achievement of favorable BER performance for both a code having a high code rate and a code having a low code rate.

Furthermore, according to one aspect of the present invention, it is possible to make a practical RC-LDPC code that encompasses a code having favorable BER performance with a high code rate and also allows coding with a low code rate.

BRIEF DESCRIPTION OF DRAWINGS

FIG. 4 is a method of matrix splitting in a working example of the present invention.

FIG. 7 is comparison of the dependence of the BER on $E_b/N_0$ between the working example and the comparative example of the present invention.

EXPLANATION OF REFERENCE NUMERALS

101 Wireless communication system, 111 Transmitting device, 112 Receiving device, 121 Coder, 131 Decoder, 151 Parity generation circuit, 201 Recording and reproducing system, 211 Recording device, 212 Reproducing device

BEST MODE FOR CARRYING OUT THE INVENTION

An embodiment of the present invention will be described below with reference to the drawings.

Figure 3:
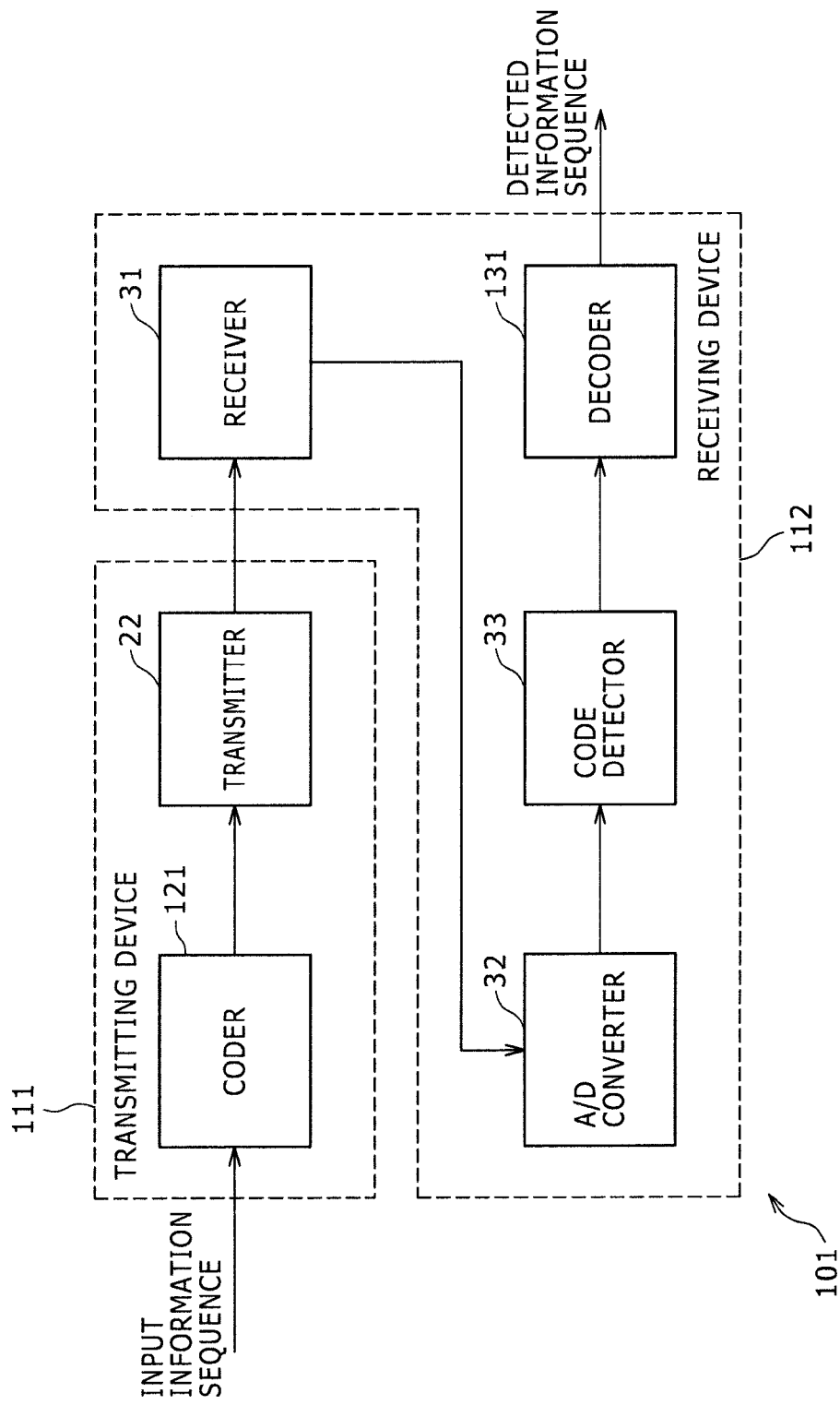
FIG. 3 is a block diagram showing the configuration of one embodiment of a wireless communication system to which the present invention is applied.

FIG. 3 is a block diagram showing the configuration of one embodiment of a wireless communication system 101 to which the present invention is applied. This wireless communication system 101 is composed of a transmitting device 111 that codes an information sequence and transmits the code sequence and a receiving device 112 that receives the code sequence and decodes it.

Figure 1:
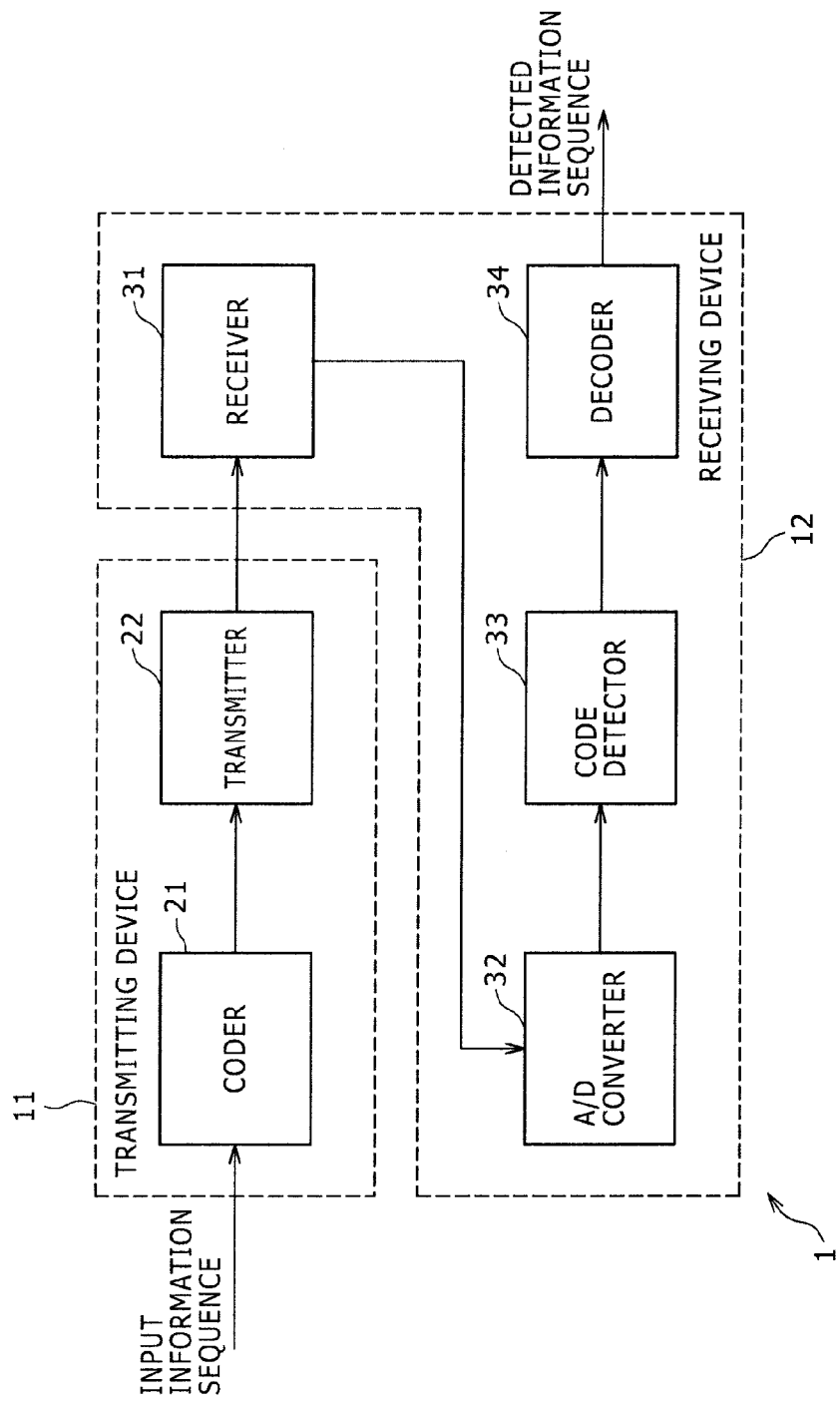
FIG. 1 is a block diagram showing the configuration of a conventional wireless communication system.
Figure 2:
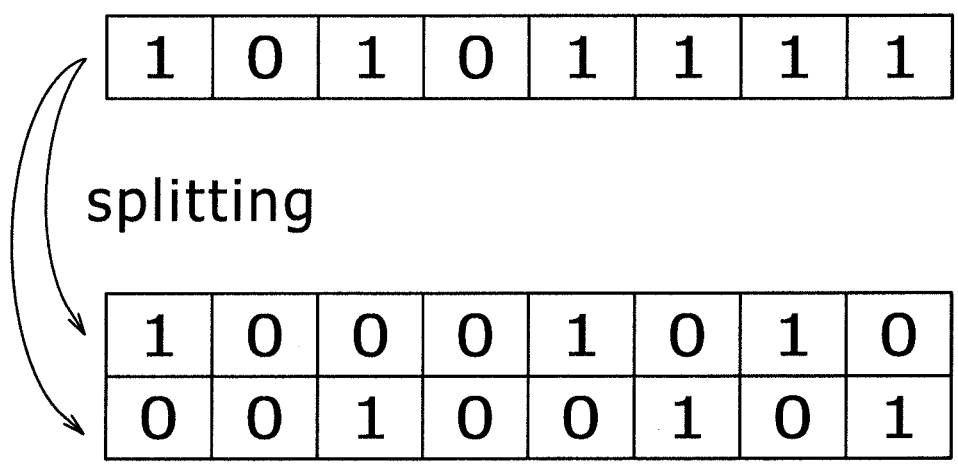
FIG. 2 is one example in which row splitting is performed in some cyclic matrices in a check matrix, disclosed in Non-patent document 8.

In the wireless communication system 101 in FIG. 3, the part corresponding to the conventional wireless communication system 1 in FIG. 1 is given the same symbol, and the description thereof is accordingly omitted. Specifically, in the wireless communication system 101 in FIG. 3, the transmitting device 111 has the same configuration as that of the transmitting device 11 in FIG. 1 except for that a coder 121 is provided instead of the coder 21. Furthermore, the receiving device 112 has the same configuration as that of the receiving device 12 in FIG. 1 except for that a decoder 131 is provided instead of the decoder 34.

The coder 121 executes coding processing based on an LDPC code for an input information sequence and supplies the code sequence obtained by the coding to a transmitter 22. Details of the coding of the LDPC code by the coder 121 will be described later.

The code sequence arising from the coding into the LDPC code is transmitted as a transmission signal by a transmitting antenna in the transmitter 22. Furthermore, in the receiving device 112, the transmission signal is received by a receiver 31 and converted to a digital reception signal by an A/D converter 32. Subsequently, the digital reception signal is converted to a detected code sequence or a sequence of information on the posterior probability by a code detector 33 and then input to the decoder 131.

Subsequently, the decoder 131 decodes the converted digital reception signal to a detected information word by using an iterative decoding method such as a Sum-Product decoding method or a BP decoding method, and outputs it as a detected information sequence. As described above, if an iterative decoding method is used in the decoder 131, a posterior probability detector is used in the code detector 33 in some cases.

Although the wireless communication system 101 composed of two devices of the transmitting device 111 and the receiving device 112 will be described in the present embodiment, it is also possible to employ a sending and receiving device in which the transmitting device 111 and the receiving device 112 in FIG. 3 are integrated with each other.

As above, in the coder 121 and the decoder 131 of FIG. 3, an LDPC code, which is one of error correcting codes effective to reduce the BER of transmission information, is used.

By the way, as the RC-LDPC codes performed in the coder 121, generally a code with a high code rate and a code with a low code rate have check matrices correlated with each other as regularly as possible. Furthermore, it is general that all of the check matrices of the RC-LDPC code having such regularity are composed of cyclic matrices in which $q \geq 2$ and $w_c$ belongs to $\{0, 1\}$.

However, if the column weight of the check matrix and the code length are constant, a self-orthogonal code having a higher code rate can be made when the column weight of the cyclic matrices in the check matrix is larger than 1. Thus, it is expected that, when the code rate is higher, an LDPC code having favorable performance can be made with a code rate in a wider range when the maximum column weight of the cyclic matrices in the check matrix is set larger.

FIG. 4 is a diagram for explaining the case in which a check matrix of q=1, composed of ten cyclic matrices whose column weight is 3, sequentially forms the check matrices of q=2 and q=4 in such a way that the maximum column weight of the cyclic matrices is decreased. In FIG. 4, 0, 1, 2, and 3 are regarded as a zero matrix, a cyclic matrix of $w_c=1$, a cyclic matrix of $w_c=2$, and a cyclic matrix of $w_c=3$, respectively.

As shown in FIG. 4, the check matrix of q=1 is composed of ten cyclic matrices whose column weight is 3. This check matrix of q=1 is split into two stages to become the check matrix of q=2 having ten cyclic matrices whose column weight is 1 or 2 at two stages. Furthermore, each of the cyclic matrices at two stages in this check matrix of q=2 is split into two stages to provide the check matrix of q=4 having ten cyclic matrices whose column weight is 0 or 1 at four stages.

Thereby, the check matrix of q=1, composed of ten cyclic matrices whose column weight is 3, sequentially forms the check matrices of q=2 and q=4 in such a way that the maximum weight of the cyclic matrices is decreased.

That is, in the present embodiment, in coding of LDPC codes that have plural code rates and whose all check matrices are composed of plural cyclic matrices, the coder 121 performs the coding in such a way that $1 < w_0$ and $w_1 < w_0$ are satisfied when the maximum column weight of the cyclic matrices in the check matrix of a certain code whose code rate is not the minimum value among the LDPC codes is defined as $w_0$ and the maximum column weight of the cyclic matrices in the check matrix of a code having a code rate lower than that of the certain code is defined as $w_1$.

However, here, the order of the respective cyclic matrices may be changed in the respective check matrices of FIG. 4. Furthermore, in the present embodiment, it is sufficient that the above-described relationship of $w_1 < w_0$ is satisfied, and the way of the splitting is not particularly limited.

However, in the case of making the check matrices of codes having different code rates like in FIG. 4, it is desirable that these check matrices are made as regularly as possible. One example of a specific method for making such regular check matrices will be described below.

The check matrix of the mother code as the original is defined as $H^0(p, q)$, and a check matrix $H^s(p, q)$ obtained by s times of row splitting is defined as follows.

[Formula 4]

$$H^s(p, q) = \begin{pmatrix} y^s_{0,0} & y^s_{0,1} & \cdots & y^s_{0,p \cdot m-1} \\ y^s_{1,0} & y^s_{1,1} & \cdots & y^s_{1,p \cdot m-1} \\ \vdots & \vdots & \ddots & \vdots \\ y^s_{q \cdot m-1,0} & y^s_{q \cdot m-1,1} & \cdots & y^s_{q \cdot m-1,p \cdot m-1} \end{pmatrix} \quad (4)$$

Here, $y^s_{i,j}$ (belongs to $\{0, 1\}$) ($0 \leq i < q \cdot m$, $0 \leq j < p \cdot m$) is the binary element in the i-th row and the j-th column of the check matrix $H^S(p, q)$.

Now, when the column weight of the check matrix $H^S(p, q)$ is a constant value w, a set composed of addresses $b^s_{j,z}$ ($0 \leq z < w$) of the rows of bit 1 in the j-th column is defined as $B^s_j = \{b^s_{j,0}, b^s_{j,1}, \ldots b^s_{j,w1}\}$. At this time, for example, in the C program, the elements in the j-th column of the check matrix are obtained in accordance with the algorithm of the following (5).

[Formula 5]

if$(i \in B^s_j) y^s_{i,j} = 1$;

else $y^s_{i,j} = 0$; (5)

Furthermore, $b^0_{j,z}$ is defined as follows based on the assumption that q=1 is set for the check matrix of the mother code and the form of the check matrix is represented by the above-described Equation (2).

[Formula 6]

$$b^0_{j,z} = (a_{j \bmod p, z} + \text{floor}(j/p)) \bmod m \quad (6)$$

In Equation (6), $a_{j,z}$ ($0 \leq j < p$, $0 \leq z < w$) is w row addresses indicating the positions of bit 1 in the first column of p cyclic matrices in the check matrix.

Here, if a consideration is made about the respective $a_{j,z}$ by taking w=3, p=10, and m=72 as one example, the following equation is obtained.

[Formula 7]

$[a_{0,0} a_{0,1} a_{0,2}] = [18\ 0\ 2]$ $[a_{1,0} a_{1,1} a_{1,2}] = [65\ 33\ 68]$ $[a_{2,0} a_{2,1} a_{2,2}] = [58\ 37\ 62]$ $[a_{3,0} a_{3,1} a_{3,2}] = [56\ 42\ 51]$ $[a_{4,0} a_{4,1} a_{4,2}] = [63\ 44\ 50]$ $[a_{5,0} a_{5,1} a_{5,2}] = [70\ 43\ 36]$ $[a_{6,0} a_{6,1} a_{6,2}] = [49\ 26\ 34]$ $[a_{7,0} a_{7,1} a_{7,2}] = [16\ 55\ 27]$ $[a_{8,0} a_{8,1} a_{8,2}] = [21\ 9\ 64]$ $[a_{9,0} a_{9,1} a_{9,2}] = [71\ 41\ 19]$ (7)

Furthermore, the check matrix $H^0(10, 1)$ of the mother code is obtained in accordance with Equations (4) to (7).

At this time, based on the check matrix $H^0(10, 1)$ of the mother code, a check matrix $H^1(10, 2)$ of q=2 arising from row splitting in accordance with FIG. 4 is obtained from Equation (4) and Equation (5) by using $B^1_j$ composed of the following $b^1_{j,z}$.

[Formula 8]

$b^1_{j,0} = b^0_{j,0}$ $b^1_{j,1} = b^0_{j,1} + m$ $b^1_{j,2} = b^0_{j,2} + (j \bmod 2)m$ (8)

Similarly, based on the check matrix $H^0(10, 1)$ of the mother code, a check matrix $H^2(10, 4)$ of q=4 arising from row splitting in accordance with FIG. 4 is obtained from Equation (4) and Equation (5) by using $B^2_j$ composed of the following $b^2_{j,z}$.

[Formula 9]

$b^2_{j,0} = b^0_{j,0} + 2\delta((j \bmod 4) = 3)m$ $b^2_{j,1} = b^0_{j,1} + (1 + 2\delta((j \bmod 4) = 2))m$ $b^2_{j,2} = b^0_{j,2} + (2 + (j \bmod 2))m$ (9)

Here, $\delta(X)$ is a function that is 1 when X is true and is 0 when X is false.

Specifically, by using three check matrices $H^0(10, 1)$, $H^1(10, 2)$, and $H^2(10, 4)$ defined by Equations (4) to (9), the respective codes with a code length of 720 bits and code rates of 9/10, 4/5, and 3/5 can be made. Furthermore, all of the codes in the present embodiment are a self-orthogonal code.

Furthermore, as is apparent from Equation (8) and Equation (9), when a certain row address indicating the position of bit 1 in a certain column of the check matrix $H^0(10, 1)$ of the code having the highest code rate is defined as b, the row address indicating the position of bit 1 in the column in the parity check matrices $H^1(10, 2)$ and $H^2(10, 4)$ of the codes having other code rates is represented as b+cm with use of an integer c that is constant for each cyclic matrix and is equal to or larger than 0.

That is, in the present embodiment, when a certain row address indicating the position of bit 1 in a certain column of the parity check matrix of the code having the highest code rate is defined as b, the row address indicating the position of bit 1 in the column in the parity check matrix of a code having another code rate is represented as b+cm with use of the integer c that is constant for each cyclic matrix and is equal to or larger than 0.

In addition, as a characteristic of the coding method of the present invention, there is a characteristic that the minimum hamming distance of a code having a low code rate, made from the mother code having a high code rate, is equal to or longer than the minimum hamming distance of the mother code. Thus, by using a code whose minimum hamming distance is as long as possible as the mother code having a high code rate as the original, a long minimum distance can be achieved for codes of all code rates.

As such a code having as long a minimum hamming distance as possible and a high code rate, there is e.g. a code whose minimum distance is equal to or longer than (the column weight of the check matrix+2) like that described in Non-patent document 4 by the present inventor.

The mother code having a code rate of 9/10, described in the working example of the present invention, is also designed based on the technique disclosed in Non-patent document 4, and the column weight of the check matrix is 3 and the minimum distance of the code is 6. Therefore, in the working example of the present invention, the minimum distance of each of the codes having code rates of 4/5 and 3/5 is also equal to or longer than 6.

For setting the code rate of the mother code as high as possible and keeping the minimum distance of all codes as long as possible, it is desirable that the minimum column weight of the check matrix is set to 3 and the minimum distance of the code is set to 6 or longer as described in the working example of the present invention.

Here, an n×(q m) check matrix $H^s(p, q)$ can be generally represented as follows by using an (nq m)×(q m) matrix $H^s_A$ composed of the first (nq m) columns and a (q m)×(q m) matrix $H^s_B$ composed of the last (q m) columns.

[Formula 10]

$$H^s(p,q)=[H^s_A H^s_B] \quad (10)$$

In the present embodiment, the order of the respective elements is adjusted in advance in the respective vectors of Equation (7) in such a way that the following Equation (11) is satisfied for all s.

[Formula 11]

$$Det(H^s_B) \bmod 2=1 \quad (11)$$

However, this adjustment can be carried out also by changing the coefficient of m in Equation (8) and Equation (9).

Furthermore, from Equation (10) and Equation (11), the generator matrices $G^s$ of the respective codes can be obtained as shown by the following Equation (12).

[Formula 12]

$$G^s H^{s-1}_B [H^s_A H^s_B] = [H^{s-1}_B \cdot H^s_A 1] \quad (12)$$

In Equation (12), I is a (q m)×(q m) identity matrix.

In the present embodiment, all of the check matrices can be so made that they can be transformed into the format of Equation (12), and thus the positions of the parity can be arranged on the right side of the check matrix for all codes.

However, the positions of the parity may be arranged on the left side of the check matrix, or may be regularly arranged with equal intervals in the check matrix. In other words, it can also be said that the parity is disposed on the right side on the check matrix, or on the left side, or with constant intervals.

As described above, the parity is regularly arranged on all check matrices by adjusting Equations (7) to (9) in such a way that Equation (11) is satisfied for all $H^s(p, q)$. This makes it possible to easily perform coding as a general systematic code by using the method of the above-mentioned Patent document 2 or the like for example. Here, the systematic code refers to a code in which the information word is a part of the codeword.

Figure 5:
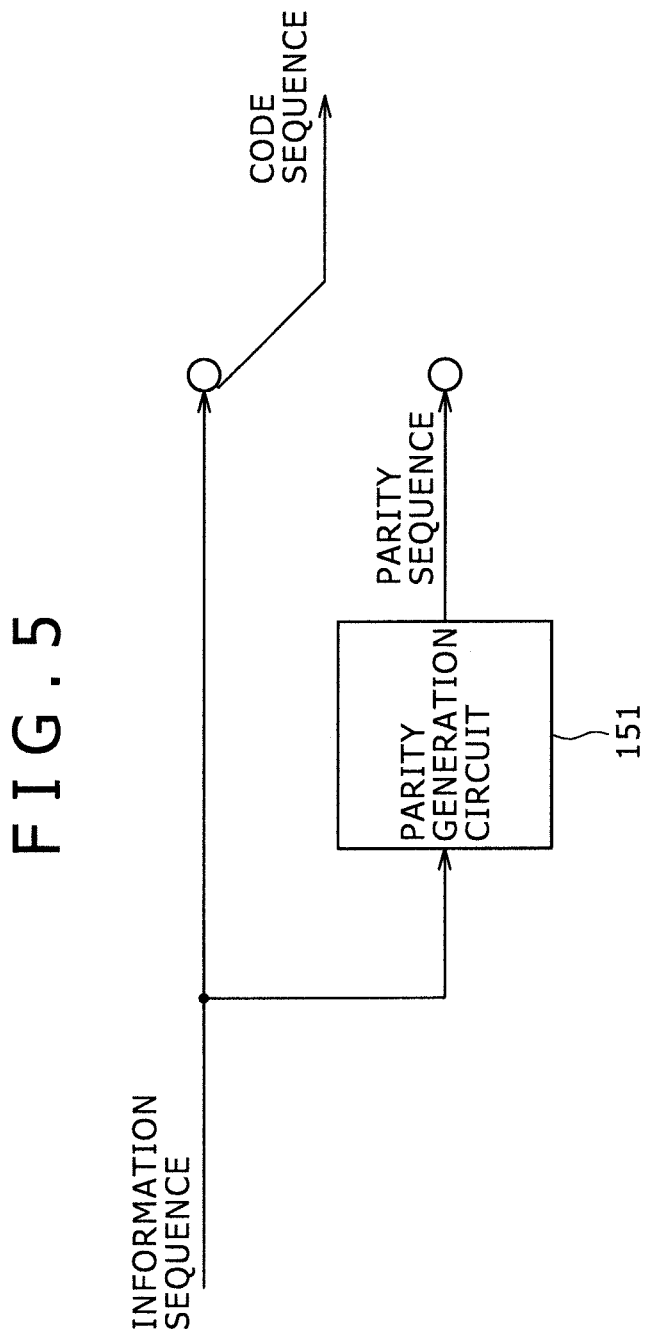
FIG. 5 is a block diagram showing the detailed configuration of a coder in FIG. 3.

FIG. 5 is a block diagram showing the detailed configuration of the coder 121 of FIG. 3. The coder 121 is formed as e.g. a coding circuit of a systematic code.

As shown in FIG. 5, in the coder 121 of FIG. 3, a parity generation circuit 151 converts an input information sequence to a parity sequence in accordance with Equation (12). The coder 121 outputs the parity sequence and a code sequence of an LDPC code formed of the information sequence to the transmitter 22.

The parity generation circuit 151 may convert the input information sequence to the parity sequence by using not only the method in accordance with Equation (12) but another method. For example, the parity generation circuit 151 may convert the input information sequence to the parity sequence in accordance with the method disclosed in Patent document 2.

As above, in the present embodiment, the coder 121 has the above-described configuration. Thus, if a check matrix of q=1 is used for the mother code, the performance thereof can be improved more greatly than the conventional "method of performing row splitting for each cyclic matrix." Here, however, the maximum column weight of the cyclic matrices in the check matrix of q=1 needs to be equal to or larger than 2.

Furthermore, in the present embodiment, although the column weight of the check matrix is any, the decoding circuit (in FIG. 3, the decoder 131) can be simplified by setting the column weight of the check matrix constant. In this case, it is desirable that the column weight of the check matrix is 3 in order to obtain a favorable BER.

Moreover, in the present embodiment, codes may be employed as RC-LDPC codes, including a code that is obtained by changing the length m of one side of an identity matrix and has a different code length. However, in this case, the check matrix needs to be so designed in advance that the decoding performance is not deteriorated even if m is changed.

Here, if the coding processing executed by the coder 121 is compared with the coding processing executed by the conventional coder 21 in FIG. 1, the following result is obtained. Specifically, FIG. 6 is a comparative example against the present embodiment (present working example), in the case in which a check matrix of q=1 composed of ten cyclic matrices whose column weight is 3 is subjected to row splitting in accordance with the conventional "method of performing row splitting for each cyclic matrix."

Figure 6:
FIG. 6 is a method of matrix splitting in a comparative example of the present invention.

As shown in FIG. 6, the check matrix of q=1 is composed of ten cyclic matrices whose column weight is 3. This check matrix of q=1 is split into two stages to become a check matrix of q=2 having ten cyclic matrices whose column weight is 0 or 3 at two stages. Furthermore, each of the cyclic matrices at two stages in this check matrix of q=2 is split into two stages to provide a check matrix of q=4 having ten cyclic matrices whose column weight is 0 or 3 at four stages.

In the comparative example of the present invention, the check matrix of the mother code is $H^0(10, 1)$, which is the same as that in the working example. At this time, two matrices for code rates of 4/5 and 3/5 in the comparative example are uniquely determined from FIG. 6.

Here, the detailed comparison of the relationship between the working example and the comparative example is as follows. Specifically, FIG. 7 is comparison of the dependence of the BER on the signal-to-noise ratio $E_b/N_0$ (dB) under white noise in BPSK (Binary Phase Shift Keying) modulation between the working example and the comparative example of the present invention.

In FIG. 7, the ordinate indicates the BER as the bit error rate, and the abscissa indicates the dependence on the signal-to-noise ratio $E_b/N_0$ (dB). Furthermore, in the graph of FIG. 7, the white circles indicate the graph of the working example in which the code rate is 9/10 and q=1. The white upward triangles indicate the graph of the working example in which the code rate is 4/5 and q 2. The black upward triangles indicate the graph of the comparative example in which the code rate is 4/5 and q=2. In addition, the white downward triangles indicate the graph of the working example in which the code rate is 3/5 and q=4. The black downward triangles indicate the graph of the comparative example in which the code rate is 3/5 and q=4. Specifically, the white marks indicate the graphs of the working example, and the black marks indicate the graphs of the comparative example.

As is apparent from FIG. 7, at $BER=10^4$, the working example of the present invention has coding gains of +0.4 dB and +1.5 dB with the code rate of 4/5 and the code rate of 3/5, respectively, compared with the comparative example. The more the row splitting is performed, the larger the deterioration of the BER in the comparative example becomes. The reason for this is as follows. Specifically, as is apparent from FIG. 6, when the check matrix of the mother code is a check matrix of q=1, if a check matrix of q=N is made through splitting of each row into N rows for each cyclic matrix, this check matrix is equivalent to a matrix in which N codes whose code length is 1/N are arranged. The code performance tends to be higher when the code length is longer. Therefore, the scheme of the comparative example results in the significant deterioration of the performance thereof.

In addition, as is apparent from FIG. 7, the codes of the working example of the present invention involve no observation of the error-floor for all code rates, and exhibits favorable BER performance.

As above, the present invention can set the coding gain with a low code rate higher compared with the case in which the conventional "method of performing row splitting for each cyclic matrix" is applied when the column weight of the cyclic matrices is equal to or larger than 2.

However, conventionally, there is no precedent in which the "method of performing row splitting for each cyclic matrix" is applied when the column weight of the cyclic matrices is equal to or larger than 2. Conventionally, only there is a precedent in which the "method of performing row splitting for each cyclic matrix" is applied when the column weight of the cyclic matrices is 1.

Thus, the following interpretation is also possible. Specifically, in the case of the code to which the present invention is applied, essentially, the performance of the code that has the lowest code rate and whose check matrix is composed of cyclic matrices whose column weight is 1 is equivalent to that of the conventional codes, and a code having a high code rate is efficiently made through enhancement in the column weight of the cyclic matrices.

Conventionally, there is no precedent in which an RC-LDPC code including as high a code rate as 9/10 is made with as short a code length as 720 bits.

Figure 8:
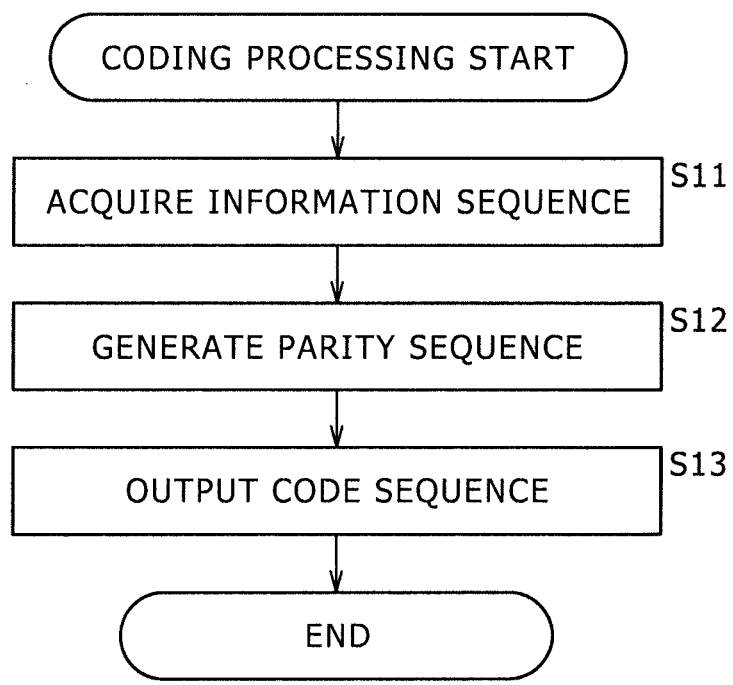
FIG. 8 is a flowchart for explaining coding processing.

Subsequently, with reference to the flowchart of FIG. 8, the coding processing executed by the coder 121 in FIG. 3 will be described below.

In a step S11, the coder 121 acquires an information sequence input from e.g. external apparatus.

In a step S12, the parity generation circuit 151 converts the acquired information sequence e.g. in accordance with Equation (12) to generate a parity sequence.

In a step S13, the coder 121 outputs the generated parity sequence and a code sequence of an LDPC code formed of the information sequence, so that the coding processing is ended.

In the above-described manner, in coding, by the coder 121, into LDPC codes that have plural code rates and whose all check matrices are composed of plural cyclic matrices, the coding is so performed that $1 < w_0$ and $w_1 < w_0$ are satisfied when the maximum column weight of the cyclic matrices in the check matrix of a certain code whose code rate is not the minimum value among the LDPC codes is defined as $w_0$ and the maximum column weight of the cyclic matrices in the check matrix of a code having a code rate lower than that of the certain code is defined as $w_1$.

By the way, although description is made in the present embodiment about the wireless communication system 101 composed of the transmitting device 111 and the receiving device 112, it is also possible to apply the present invention to e.g. a recording and reproducing system composed of a recording device and a reproducing device.

Figure 9:
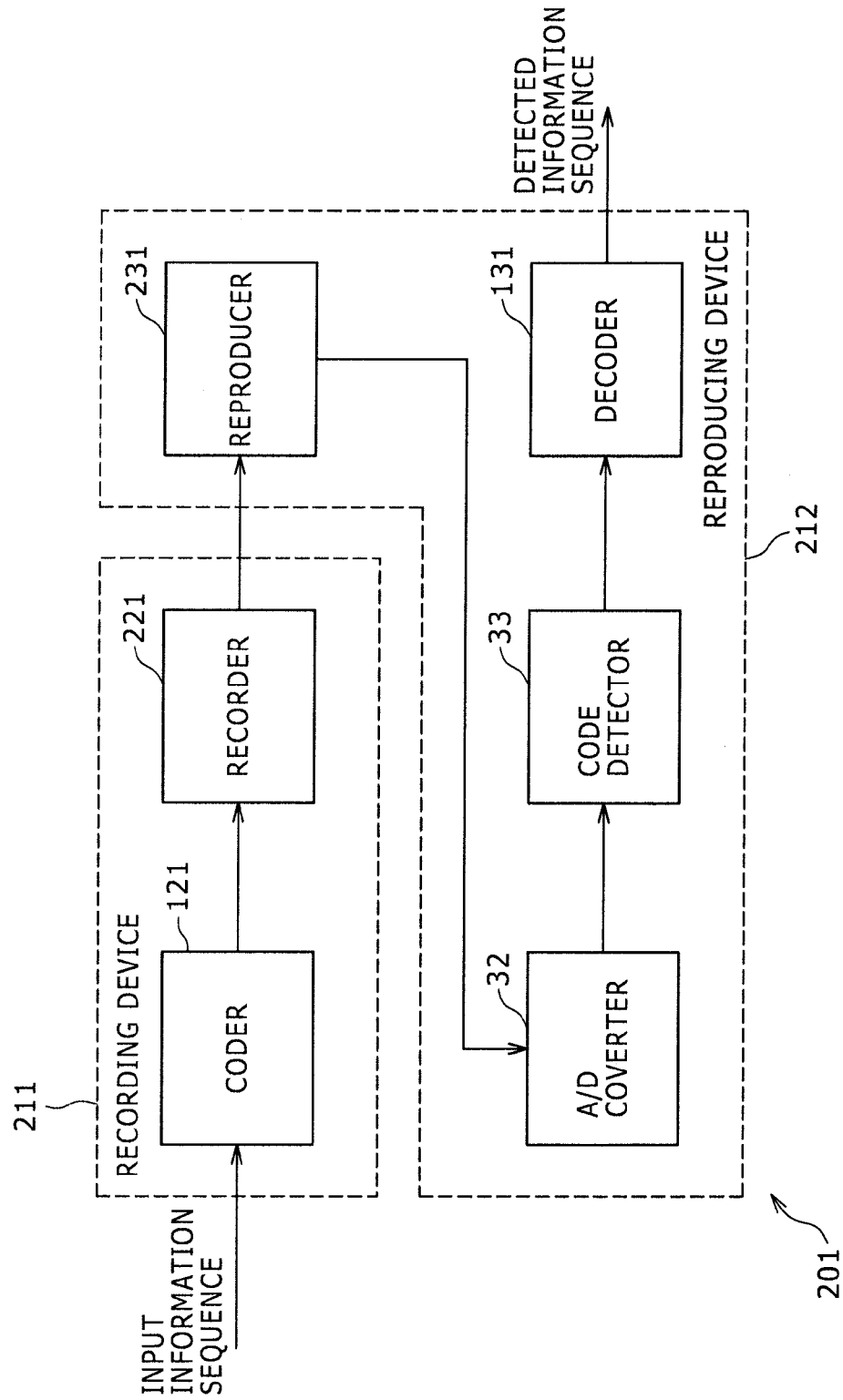
FIG. 9 is a block diagram showing the configuration of one embodiment of a recording and reproducing system to which the present invention is applied.

FIG. 9 is a block diagram showing the configuration of one embodiment of a recording and reproducing system 201 to which the present invention is applied. This recording and reproducing system 201 is e.g. one example of a storage system, and is a system composed of a recording device 211 and a reproducing device 212.

In the recording and reproducing system 201 in FIG. 9, the part corresponding to the wireless communication system in FIG. 3 is given the same symbol, and the description thereof is accordingly omitted. Specifically, in the recording device 211 in FIG. 9, a recorder 221 is provided instead of the transmitter 22 in the transmitting device 111 in FIG. 3. Furthermore, the reproducing device 212 has the same configuration as that of the case of FIG. 3 except for that a reproducer 231 is provided instead of the receiver 31 in the receiving device 112 in FIG. 3.

In the recording device 211, the recorder 221 records a recording signal corresponding to a code sequence from the coder 121 on a recording medium, which is not diagrammatically represented, by using an optical pick-up, a magnetic head, or the like.

In the reproducing device 212, the reproducer 231 converts the recording signal recorded on the recording medium, which is not diagrammatically represented, by the analog optical pick-up or the magnetic head to an analog reproduced signal, and supplies it to the A/D converter 32.

In the recording and reproducing system 201 having the above-described configuration, the recording device 211 records the code sequence arising from coding into an LDPC code on the recording medium similarly to the wireless communication system 101 in FIG. 3.

The recording and reproducing system 201 in FIG. 9 may be formed as a recording and reproducing device in which the recording device 211 and the reproducing device 212 are integrated with each other.

As described above, the present invention makes it possible to make practical RC-LDPC codes encompassing a code having favorable BER performance with a high code rate particularly. Furthermore, codes from a code having a high code rate to a code having a low code rate can achieve a favorable BER.

In addition, the present invention makes it possible to form a practical coder by setting the positions of parity in the check matrices of plural codes to the desired positions. Moreover, a specific method for, in this case, setting the positions of parity to the desired positions on the check matrices for all codes having different code rates after keeping the regularity of the check matrix constant in both the parity part and the information word part is made clear.

The present invention is suitable for being used in a coding device for a code for reducing the error rate of a transmission signal and used to decode plural codes having different code rates by using a single decoder in various kinds of communication devices such as a LAN (Local Area Network), a PAN (Personal Area Network), television broadcasting, a portable phone, and Ethernet (registered trademark).

The above-described series of processing can be executed by hardware, or can be executed by software. If the series of processing is executed by software, a program of the software is installed from a program recording medium into a computer incorporated in dedicated hardware or e.g. a general-purpose personal computer that is allowed to execute various kinds of functions through installation of various kinds of programs therein.

Figure 10:
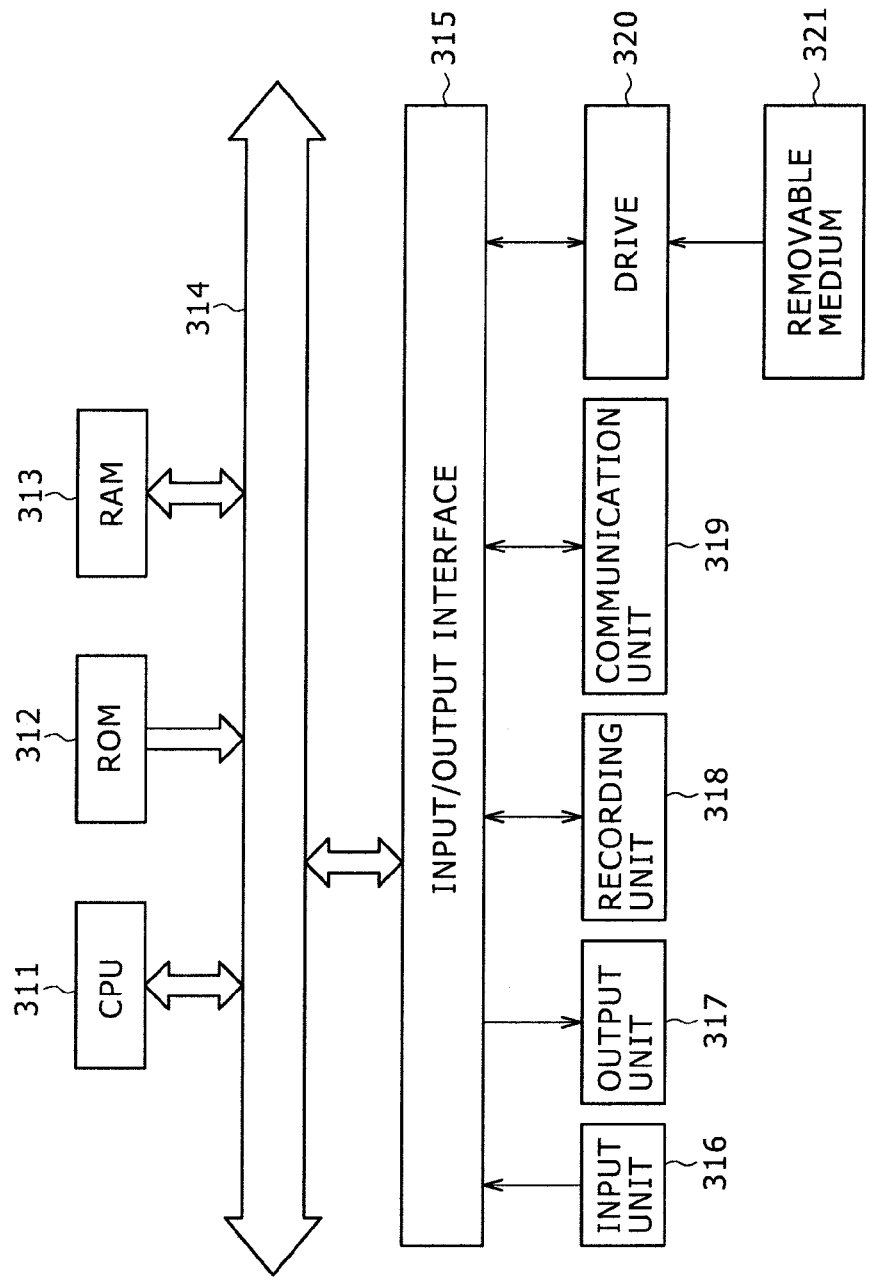
FIG. 10 is a block diagram for explaining the configuration of a personal computer.

FIG. 10 is a block diagram showing an example of the configuration of a personal computer that executes the above-described series of processing based on a program. A CPU (Central Processing Unit) 311 executes various kinds of processing in accordance with a program recorded in a ROM (Read Only Memory) 312 or a recording unit 318. A program to be executed by the CPU 311, data, and so on are accordingly stored in a RAM (Random Access Memory) 313. These CPU 311, ROM 312, and RAM 313 are connected to each other via a bus 314.

An input/output interface 315 is also connected to the CPU 311 via the bus 314. To the input/output interface 315, an input unit 316 formed of a microphone and so on, and an output unit 317 formed of a display, a speaker, and so on are connected. The CPU 311 executes various kinds of processing in response to commands input via the input unit 316. Furthermore, the CPU 311 outputs the results of the processing to the output unit 317.

The recording unit 318 connected to the input/output interface 315 is formed of e.g. a hard disc, and a program to be executed by the CPU 311 and various kinds of data are recorded therein. A communication unit 319 communicates with an external device via a network such as the Internet or a local area network.

Furthermore, a program may be acquired via the communication unit 319 and recorded in the recording unit 318.

When a removable medium 321 such as a magnetic disc, an optical disc, a magneto-optical disc, or a semiconductor memory is loaded in a drive 320 connected to the input/output interface 315, the drive 320 drives them to acquire a program, data, and so on recorded therein. The acquired program and data are transferred to the recording unit 318 and recorded therein according to need.

The program recording medium for storing a program that is installed in a computer and is set to such a state as to be executable by the computer is formed of, as shown in FIG. 10, the removable medium 321 as a package medium formed of a magnetic disc (encompassing a flexible disc), an optical disc (encompassing a CD-ROM (Compact Disc-Read Only Memory) and a DVD (Digital Versatile Disc)), a magneto-optical disc, a semiconductor memory, or the like, or the ROM 312 in which a program is temporarily or permanently stored, a hard disc serving as the recording unit 318, or the like. Storing of a program in the program recording medium is carried out by utilizing a wired or wireless communication medium such as a local area network, the Internet, or digital satellite broadcasting via the communication unit 319 as an interface such as a router or a modem according to need.

In the present specification, the steps that describe the program stored in the recording medium encompass processing that is to be executed along the described order in a time-series manner, of course, and also processing that is not necessarily to be executed in a time-series manner but to be executed in parallel or individually.

Furthermore, in the present specification, the system refers to the whole of a device composed of plural devices.

Embodiments of the present invention are not limited to the above-described embodiments but various changes are possible without departing from the gist of the present invention.

The invention claimed is:

1. A data encoding method employing a data coding device for coding LDPC (low-density parity-check) code that have a plurality of code rates and whose all parity check matrices are composed of a plurality of cyclic matrices, the data encoding method being implemented by a microprocessor, the method comprising:

Providing a translation of data words into codewords so that the relationships $1<W_0$ and $w_1<w_0$ are satisfied when a maximum column weight of the cyclic matrices in a check matrix of a certain code whose code rate is not a minimum value among the LDPC codes is satisfied as $W_0$ and a maximum column weight of the cyclic matrices in the check matrix of a code having a code rate lower than the code rate of the certain code is defined as $w_1$.

2. The data encoding method according to claim 1, wherein when one side of the cyclic matrix in a parity check row is defined as m, based on assumption that a certain row address indicating a position of bit 1 in a certain column in the parity check matrix of a code having a high code rate is b, a row address indicating a position of bit 1 in the column in the parity check matrix of a code having a lower code rate can be represented as b+cm with use of an integer c that is constant for each cyclic matrix and is equal to or larger than 0.

3. The data encoding method according to claim 2, wherein a value of b or c is so adjusted that all of positions of parity in the check matrices of the codes are on a right side on the check matrix, or on a left side, or with constant intervals.

4. The data encoding method according to claim 3, wherein the number of cyclic matrices in the parity check matrix of a code having a highest code rate is only one in a row direction, and $2<w_0$ is satisfied.

5. The data encoding method according to claim 4, wherein a column weight of the cyclic matrices in the parity check matrix of a code having a lowest code rate is 0 or 1.

6. The data encoding method according to claim 5, wherein a column weight of the parity check matrix is constant for the codes of all of the code rates.

7. The data encoding method according to claim 6, wherein a column weight of the parity check matrix is 3.

8. The data encoding method according to claim 7, wherein all of the codes are self-orthogonal.

9. The data encoding method according to claim 8, wherein a minimum hamming distance of all of the codes is at least 6.

10. The data encoding method according to claim 4, wherein a data word is translated into a code word that is obtained by changing length m of one side of an identity matrix and has a different code length.

11. A data encoding device for coding of LDPC codes that have a plurality of code rates and whose all parity check matrices are composed of a plurality of cyclic matrices, the data encoding device comprising:

circuitry performing coding by converting data words into code words such that the relationships $1<w_0$ and $w_1<w_0$ are satisfied where a maximum column weight of the cyclic matrices in the certain check matrix whose code rate is not a minimum value among the LDPC codes is defined as $w_0$ and a maximum column weight of the cyclic matrices in the check matrix of a code having a code rate lower than the code rate is defined as $w_1$.

12. The data encoding device according to claim 11, wherein when one side of the cyclic matrix in a parity check row is defined as m, based on assumption that a certain row address indicating a position of bit 1 in a certain column in the parity check matrix of a code having a high code rate is b, a row address indicating a position of bit 1 in the column in the parity check matrix of a code having a lower code rate can be represented as b+cm with use of an integer c that is constant for each cyclic matrix and is equal to or larger than 0.

13. The data encoding device according to claim 12, wherein
a value of b or c is so adjusted that all of positions of parity in the check matrices of the codes are on a right side on the check matrix, or on a left side, or with constant intervals.

14. The data encoding device according to claim 13, wherein
the number of cyclic matrices in the parity check matrix of a code having a highest code rate is only one in a row direction, and $2<w_0$ is satisfied.

15. The data encoding device according to claim 14, wherein
column weight of the cyclic matrices in the parity check matrix of a code having a lowest code rate is 0 or 1.

16. The data encoding device according to claim 15, wherein
column weight of the parity check matrix is constant for the codes of all of the code rates.

17. The data encoding device according to claim 16, wherein
a column weight of the parity check matrix is 3.

18. The data encoding device according to claim 17, wherein
all of the codes are self-orthogonal.

19. The data encoding device according to claim 18, wherein
a minimum hamming distance of all of the codes is at least 6.

20. The data encoding device according to claim 14, wherein
coding is performed, including a code that is obtained by changing length m of one side of an identity matrix and has a different code length.

* * * * *